United States Patent
Proulx et al.

(10) Patent No.: US 11,983,422 B1
(45) Date of Patent: May 14, 2024

(54) PSLC-SCAN-BASED STORAGE DEVICE INITIALIZATION SYSTEM

(71) Applicant: Dell Products L.P., Round Rock, TX (US)

(72) Inventors: Robert Proulx, Holden, MA (US); Erhan Aslan, Jamaica Plain, MA (US); Samuel Hudson, Pittsfield, MA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/180,315

(22) Filed: Mar. 8, 2023

(51) Int. Cl.
*G06F 12/00* (2006.01)
*G06F 3/06* (2006.01)

(52) U.S. Cl.
CPC .......... *G06F 3/0632* (2013.01); *G06F 3/0604* (2013.01); *G06F 3/0679* (2013.01)

(58) Field of Classification Search
CPC ..... G06F 3/0632; G06F 3/0604; G06F 3/0679
See application file for complete search history.

(56) References Cited

U.S. PATENT DOCUMENTS

| | | | |
|---|---|---|---|
| 8,169,825 B1 | 5/2012 | Shalvi et al. | |
| 9,543,025 B2 | 1/2017 | Fitzpatrick et al. | |
| 2014/0310445 A1* | 10/2014 | Fitzpatrick | G06F 12/0246 711/103 |
| 2017/0206979 A1* | 7/2017 | Cohen | G11C 29/028 |
| 2020/0364103 A1* | 11/2020 | Sharifi Tehrani | G06F 11/0727 |
| 2022/0115074 A1* | 4/2022 | Teoh | G11C 16/0483 |

* cited by examiner

Primary Examiner — John A Lane
(74) Attorney, Agent, or Firm — Joseph Mencher

(57) ABSTRACT

A pseudo Single Level Cell (pSLC)-scan-based storage device initialization system includes a chassis, a storage subsystem that is housed in the chassis, and a pSLC-scan-based storage device initialization subsystem that is housed in the chassis and coupled to the storage subsystem. The pSLC-scan-based storage device initialization subsystem reads respective subsets of pSLC data from the storage subsystem over a plurality of different read voltage thresholds, and identifies a first read voltage threshold that is included in the plurality of different read voltage thresholds and at which a respective first subset of the pSLC data read from the storage subsystem experienced errors within a predetermined error range. The pSLC-scan-based storage device initialization subsystem then uses the first read voltage threshold to estimate a powered-off data retention time for the storage subsystem, and performs post-data-retention initialization operations based on the powered-off data retention time for the storage subsystem.

20 Claims, 12 Drawing Sheets

| PEC < 30000 | | PEC > 30000 | |
|---|---|---|---|
| $V_t$ | DR time (days) | $V_t$ | DR time (days) |
| > 65 | 0 | > 95 | 0 |
| 64 | 30 | 93 | 6 |
| 63 | 50 | 91 | 13 |
| < 62 | 90 | 89 | 21 |
| | | 87 | 27 |
| | | 85 | 31 |
| | | 83 | 35 |
| | | 81 | 39 |
| | | 79 | 42 |
| | | 77 | 45 |
| | | 75 | 50 |
| | | 73 | 54 |
| | | 71 | 57 |
| | | 69 | 61 |
| | | 67 | 68 |
| | | 65 | 75 |
| | | 63 | 82 |
| | | < 61 | 90 |

PSLC-SCAN-BASED STORAGE DEVICE INITIALIZATION SYSTEM

BACKGROUND

The present disclosure relates generally to information handling systems, and more particularly to initializing storage devices used in information handling systems based on data retention information derived from a pseudo Single Level Cell (pSLC) scan.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handlings systems such as, for example, server devices, desktop computing devices, laptop/notebook computing devices, tablet computing devices, mobile phones, and/or other computing devices known in the art, use storage devices such as, for example, Solid State Drive (SSD) storage devices, for the storage of their data. SSD storage devices include NAND storage subsystems that store the data in those SSD storage devices as voltages, and when those NAND storage subsystems are in an unpowered/offline state, the voltages in those NAND storage subsystems may "leak" or otherwise reduce. For example, and as will be appreciated by one of skill in the art in possession of the present disclosure, when left in an unpowered/offline state for a relatively long period of time (e.g., 3 months or other "data retention events" known in the art), the bits of data stored in relatively higher voltages states in the NAND storage subsystems in an SSD storage device can reduce significantly and will trend towards zero volts over a long enough timeline. Such data retention events present issues with initialization of such SSD storage devices, as the reduction of voltages in the NAND storage subsystems can make it difficult to read back the correct data that was initially stored in the NAND storage subsystems, and particular read voltage threshold(s) must be identified that separate the states of bits of data stored in those NAND storage subsystems.

For example, the initialization of SSD storage devices may require firmware in the SSD storage device to attempt the use of multiple different read voltage thresholds in an attempt to read the data stored its NAND storage subsystems, particularly when that SSD storage device has experienced a data retention event. Furthermore, the firmware on that SSD storage device will typically operate to test all of the data stored on its NAND storage subsystems to determine its error rates, and then perform garbage collection on any data that exhibits relatively high error rates. As such, the conventional initialization of an SSD storage device requires a variety of operations to deal with the possibility that the SSD storage device may have experienced a data retention event, which can delay the availability of the SSD storage device and/or reduce its performance even in situations when the SSD storage device was unpowered/offline for a relatively short amount of time.

Some conventional SSD storage devices attempt to address the issues discussed above by estimating an amount of time the SSD storage device was unpowered/offline via a read voltage threshold trial and error process. For example, during initialization, the firmware in the SSD storage device may first use a "normal" read voltage threshold (e.g., that assumes no data retention event has occurred) to read data from its NAND storage subsystems, and in the event that read fails (e.g., the data that is read includes errors that exceed the capabilities of error correction techniques), firmware in the SSD storage device may then iterate through a table of "alternative" read voltage thresholds that assume different levels of data retention have occurred in the SSD storage device in the hopes that one of the associated reads will succeed.

However, while this trial and error process can glean some information about data-retention-based read voltage threshold movement in the NAND storage subsystems, such techniques present challenges in NAND storage subsystems that employ Triple Level Cell (TLC) technologies having eight voltage states, each of which may have a different read voltage threshold response to a data retention event. Furthermore, there can be significant variation in the read voltage threshold behavior across various pages in the NAND storage subsystems as well, which also presents difficulties in determining read voltage threshold movement resulting from data retention events. Further still, read voltage thresholds can be affected while the SSD storage device is online/powered, and separating the offline/unpowered data retention effects from the online/powered data retention effects is difficult. While some have suggested the use of TLC pages to estimate data retention times, such solutions suffer from disadvantages as TLC pages often include multiple read windows resulting in a relatively large number of degrees of freedom that may each be altered at once and make it difficult to identify data retention effects, the analog voltages stored in NAND cells are divided among many bits states that reduce the scan range and resulting resolution, and the error rate of TLC pages is relatively high such that scanning at sub-optimal read levels often leads to undecodable results and forces more elaborate error correction techniques.

Accordingly, it would be desirable to provide a storage device initialization system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a pseudo Single Level Cell (pSLC)-scan-based storage device initialization engine that is configured to: read respective subsets of pSLC data from a storage subsystem over a plurality of different read voltage thresholds; identify a first read voltage threshold that is included in the plurality of different read voltage thresholds and at which a respective first subset of the pSLC data read from the storage subsystem experienced errors within a predetermined error range; use the first read voltage threshold to estimate a powered-off data retention time for the storage subsystem; an perform post-data-retention initialization operations based on the powered-off data retention time for the storage subsystem.

BRIEF DESCRIPTION OF THE DRAWINGS

FIG. 9 is a table view illustrating an embodiment of a program-erase-cycle-based read voltage threshold/data retention time table that may be used during the method of FIG. 3.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
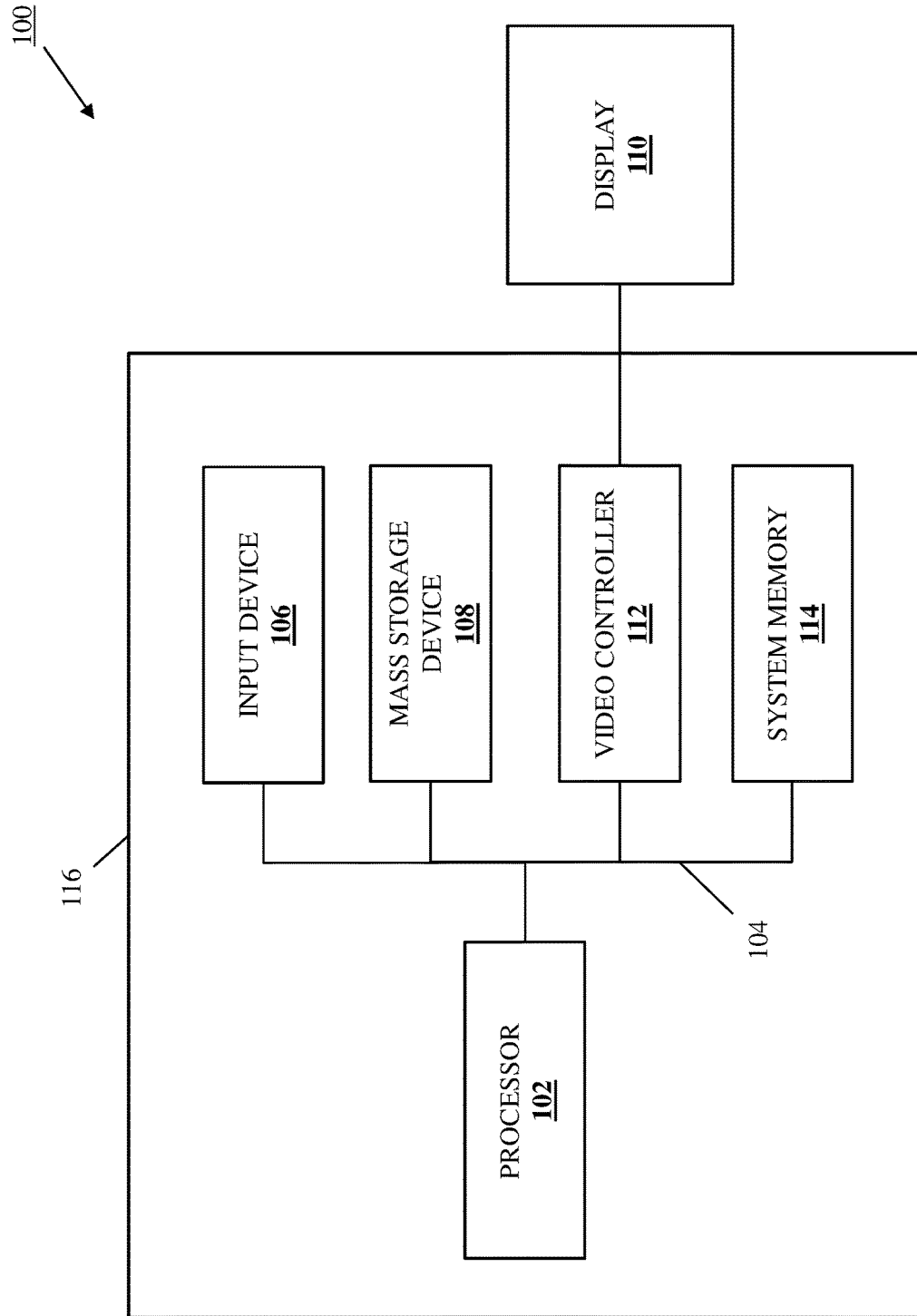
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
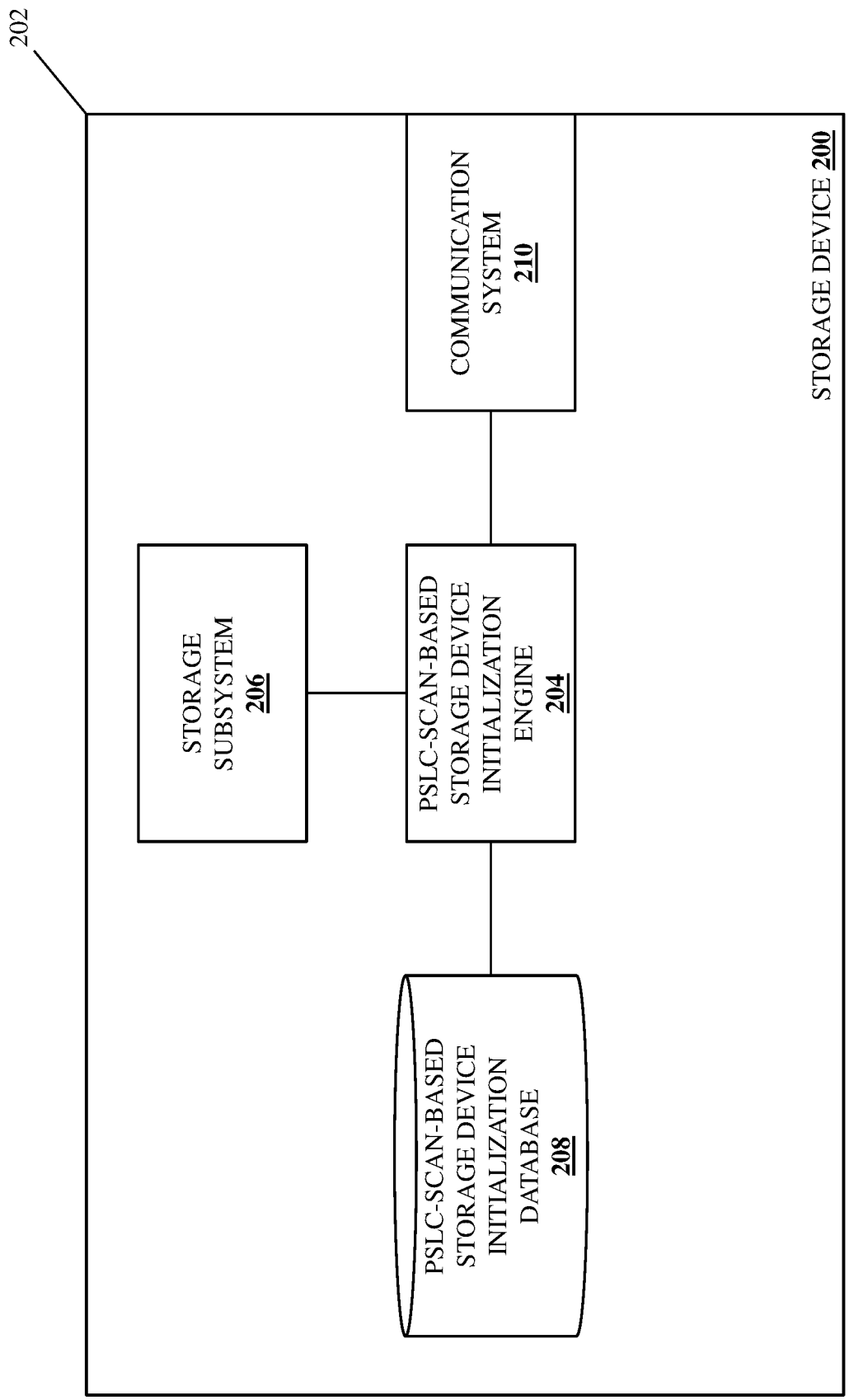
FIG. 2 is a schematic view illustrating an embodiment of a storage device that may include the pSLC-scan-based storage device initialization system of the present disclosure.

Referring now to FIG. 2, an embodiment of a storage device 200 is illustrated that may include the pSLC-scan-based storage device initialization system of the present disclosure. In an embodiment, the storage device 200 may be provided in the IHS 100 discussed above with reference to FIG. 1 (e.g., as the mass storage device 108 discussed above with reference to FIG. 1), and specific examples may be provided by a Solid State Drive (SSD) storage device. However, while illustrated and discussed as being provided by an SSD storage device, one of skill in the art in possession of the present disclosure will recognize that the functionality of the storage device 200 discussed below may be provided in other types of storage devices that are configured to operate similarly as the storage device 200 discussed below. In the illustrated embodiment, the storage device 200 includes a chassis 202 that houses the components of the storage device 200, only some of which are illustrated and described below.

For example, the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a pSLC-scan-based storage device initialization engine 204 that is configured to perform the functionality of the pSLC-scan-based storage device initialization engines, pSLC-scan-based storage device initialization subsystems, and/or storage devices discussed below. To provide a specific example, the processing system and memory system that provide the pSLC-scan-based storage device initialization engine 204 may be included in the storage device 200 as part of a storage device controller (e.g., an SSD controller), storage device firmware (e.g., SSD firmware), and/or other storage device components that would be apparent to one of skill in the art in possession of the present disclosure.

The chassis 202 may also house a storage subsystem 206 that is coupled to the pSLC-scan-based storage device initialization engine 204 (e.g., via a coupling between the storage subsystem 206 and the processing system) and that may be provided by NAND storage subsystems and/or other SSD storage subsystems that would be apparent to one of skill in the art in possession of the present disclosure. However, while described as being provided by NAND storage subsystems, one of skill in the art in possession of the present disclosure will appreciate that other storage subsystems may benefit from the teachings of the present disclosure and thus will fall within its scope as well. In the illustrated embodiment, the pSLC-scan-based storage device initialization engine 204 may have access to pSLC-scan-based storage device initialization database 208 that is configured to store any of the information utilized by the pSLC-scan-based storage device initialization engine 204 discussed below, and one of skill in the art in possession of the present disclosure will appreciate how the pSLC-scan-based storage device initialization database 208 may be provided by the storage subsystems 206 and/or other storage elements included in the chassis 202.

The chassis 202 may also house a communication system 210 that is coupled to the pSLC-scan-based storage device initialization engine 204 (e.g., via a coupling between the communication system 210 and the processing system) and that may be provided by any of a variety of storage device communication components that would be apparent to one of skill in the art in possession of the present disclosure. However, while a specific storage device 200 has been illustrated and described, one of skill in the art in possession of the present disclosure will recognize that storage devices (or other devices operating according to the teachings of the present disclosure in a manner similar to that described below for the storage device 200) may include a variety of components and/or component configurations for providing conventional storage device functionality, as well as the functionality discussed below, while remaining within the scope of the present disclosure as well.

Figure 3:
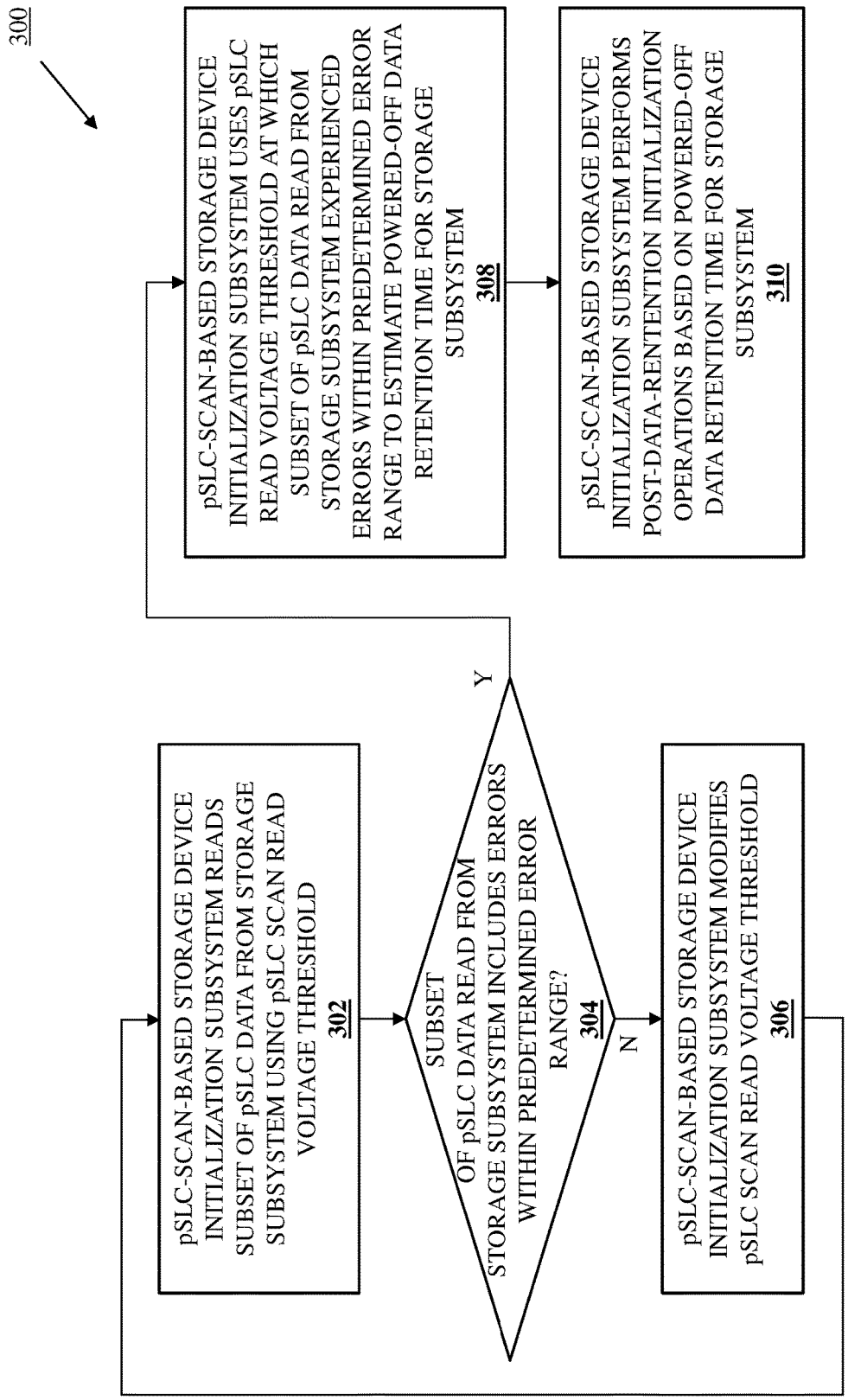
FIG. 3 is a flow chart illustrating an embodiment of a method for initializing a storage device based on data retention information derived from a pSLC scan.

Referring now to FIG. 3, an embodiment of a method 300 for initializing a storage device based on data retention information derived from a pSLC scan is illustrated. As discussed below, the systems and methods of the present disclosure provide for the estimation of a powered-off data retention time for a storage subsystem using information derived from a pSLC scan, and the performance of post-data-retention initialization operations based on that powered-off data retention time. For example, pSLC-scan-based storage device initialization system of the present disclosure may include a chassis, a storage subsystem that is housed in the chassis, and a pSLC-scan-based storage device initialization subsystem that is housed in the chassis and coupled to the storage subsystem. The pSLC-scan-based storage device initialization subsystem reads respective subsets of pSLC data from the storage subsystem over a plurality of different read voltage thresholds, and identifies a first read voltage threshold that is included in the plurality of different read voltage thresholds and at which a respective first subset of the pSLC data read from the storage subsystem experienced errors within a predetermined error range. The pSLC-scan-based storage device initialization subsystem then uses the first read voltage threshold to estimate a powered-off data retention time for the storage subsystem, and performs post-data-retention initialization operations based on the powered-off data retention time for the storage subsystem. As such, post-data-retention initialization operations for a storage device may be optimized based on the amount of time the storage device was powered off.

Figure 4:
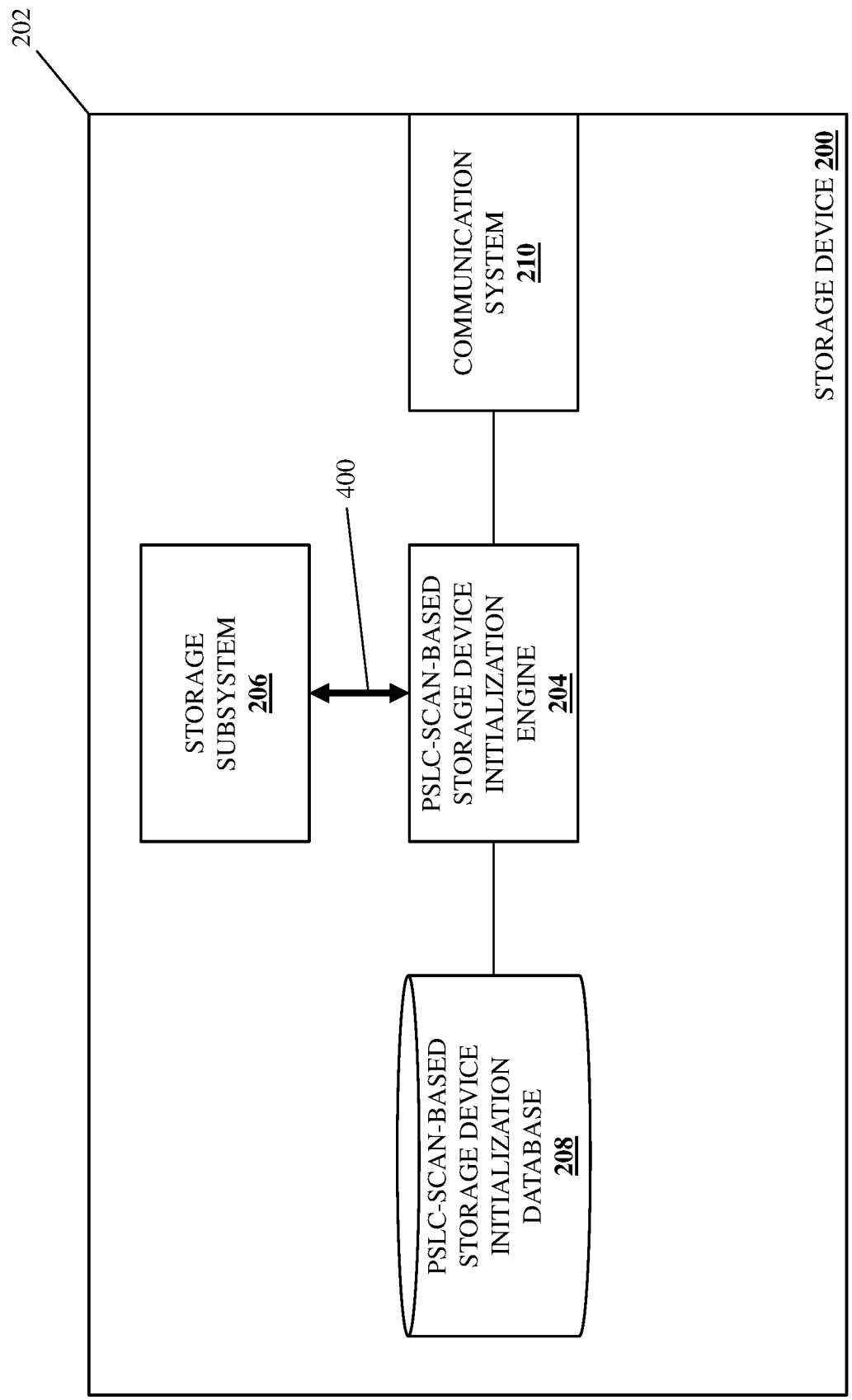
FIG. 4 is a schematic view illustrating an embodiment of the operation of the storage device of FIG. 2.

The method 300 begins at block 302 where a pSLC-scan-based storage device initialization subsystem reads a subset of pSLC data from a storage subsystem using a pSLC scan read voltage threshold. With reference to FIG. 4, in an embodiment of block 302, the pSLC-scan-based storage device initialization engine 204 in the storage device 200 may perform pSLC scan operations 400 that may include reading a subset of pSLC data from the storage subsystem using a pSLC scan read voltage threshold as part of a "pSLC scan". As will be appreciated by one of skill in the art in possession of the present disclosure, the storage subsystem 206 may utilize Multi Level Cell (MLC) NAND devices that are configured to store 2 bits per cell, or Triple Level Cell (TLC) NAND devices that are configured to store 3 bits per cell. Furthermore, a portion of those MLC/TLC NAND devices in the storage subsystem 206 may be configured as pseudo Single Level Cell (pSLC) NAND devices that are configured to store 1 bit per cell in order to, for example, enhance the reliability and lifetime of that portion of those MLC/TLC NAND devices in the storage subsystem 206 that may store metadata, storage device configuration information, tables that allow the translation of logical block addresses to physical NAND locations, and other firmware numerical data, and/or other relatively important information that is needed to utilize the storage subsystem 206/ storage device 200.

As such, the pSLC scan performed across multiple iterations of block 302 as discussed below may read pSLC data (e.g., the metadata needed to utilize the storage subsystem 206/storage device 200 discussed above) from the portion of the storage subsystem 206 that has had its MLC/TLC NAND devices configured as pSLC NAND devices for use in initialization and subsequent utilization of the storage subsystem 206/storage device 200. However, one of skill in the art in possession of the present disclosure will appreciate that while conventional storage devices perform the pSLC scan and read such pSLC data from their storage subsystems at a single read voltage threshold (i.e., a read voltage threshold likely to result in the fewest errors in the pSLC data that is read), the systems and methods of the present disclosure provide for the reading of subsets of the pSLC data from the storage subsystem during the pSLC scan at a plurality of different read voltage thresholds in order to allow information to be derived from the pSLC scan that allows for the estimation of a powered off data retention time for the storage subsystem 206/storage device 200, as discussed below.

Figure 5:
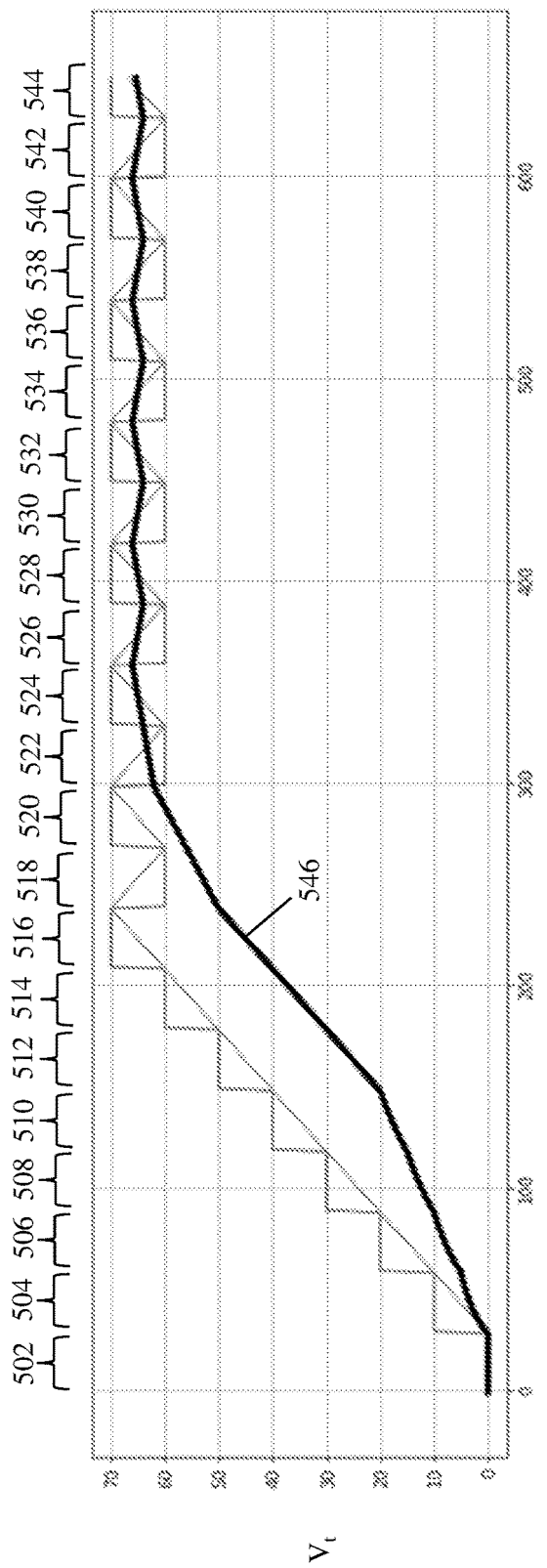
FIG. 5 is a graph view illustrating an embodiment of a pSLC scan that may be performed over a plurality of different read voltage thresholds during the method of FIG. 3.

With reference to FIG. 5, an embodiment of a graph 500 of read voltage thresholds used to read blocks from the storage subsystem 206 during a pSLC scan that may be performed over multiple iterations of block 302 is illustrated. For example, the pSLC scan in the graph 500 includes a first pSLC read operation 502 that is performed at block 302 using a first read voltage threshold ("$V_t$") of 0, and one of skill in the art in possession of the present disclosure will appreciate how the "0" read voltage threshold of the illustrated embodiment may be provided by a typically proprietary baseline voltage that is defined by a manufacturer of the storage device. Furthermore, any of the other read voltage thresholds illustrated in FIG. 5 and discussed below may be provided as typically proprietary voltage "steps" that are also defined by a manufacturer of the storage device, and thus any voltages that one of skill in the art in possession of the present disclosure would appreciated are used for reading storage subsystems are envisioned as falling within the scope of the present disclosure. Furthermore, one of skill in the art in possession of the present disclosure will recognize how conventional storage devices typically perform their pSLC scan using the "baseline" read voltage threshold of 0 due to, for the example, that read voltage threshold typically resulting in the lowest error rate in the data that is read. In the specific example illustrated in FIG. 5, the pSLC read operation 502 (and subsequent pSLC read operations, discussed below) reads a subset of the pSLC data that includes approximately 30 blocks/36000 codewords, although one of skill in the art in possession of the present disclosure will appreciate how other subsets or portions of the pSLC data may be read from the storage subsystem 206 at block 302 while remaining within the scope of the present disclosure as well.

The method 300 then proceeds to decision block 304 where it is determined whether the subset of pSLC data read from the storage subsystem experienced errors within a predetermined error range. In an embodiment, at decision block 304, the pSLC-scan-based storage device initialization engine 204 in the storage device 200 may perform determination operations that include identifying errors that were experienced by the subset of pSLC data that was read at block 302 (e.g., a mean of errors for that subset of the pSLC data in the examples below), and then determining whether those errors are within a predetermined error range. In some embodiments, the determination of errors experienced during a pSLC read operation may include calculating the errors experienced by each codeword read during the pSLC read operation following the reading of that codeword.

However, one of skill in the art in possession of the present disclosure will appreciate how the calculation of errors experienced by each codeword read during the pSLC read operation following the reading of that codeword may be relatively processing-intensive on the pSLC-scan-based storage device initialization engine 204 (e.g., SSD firmware). As such, in some embodiments, the calculation of the errors experienced by codewords read during the pSLC read operation may be performed following that pSLC read operation. For example, the pSLC-scan-based storage device initialization engine 204 may configure statistic collection "buckets" in the storage subsystem 206 to monitor and record groups of codewords with different failed bit counts (e.g., a histogram having a group of codewords with 1 FBC in a first "bucket", a group of codewords with 2 FBC in a second "bucket", etc.), and then following any pSLC read operation, may calculate the errors described herein based on that histogram/statistics collection, which one of skill in the art in possession of the present disclosure will appreciate is relatively less processing-intensive on the pSLC-scan-based storage device initialization engine 204 (e.g., SSD firmware). However, while a few specific examples have been provided, one of skill in the art in possession of the present disclosure will appreciate how errors experienced by pSLC data read from a storage subsystem may be identified in other manners that will fall within the scope of the present disclosure as well.

Figure 6:
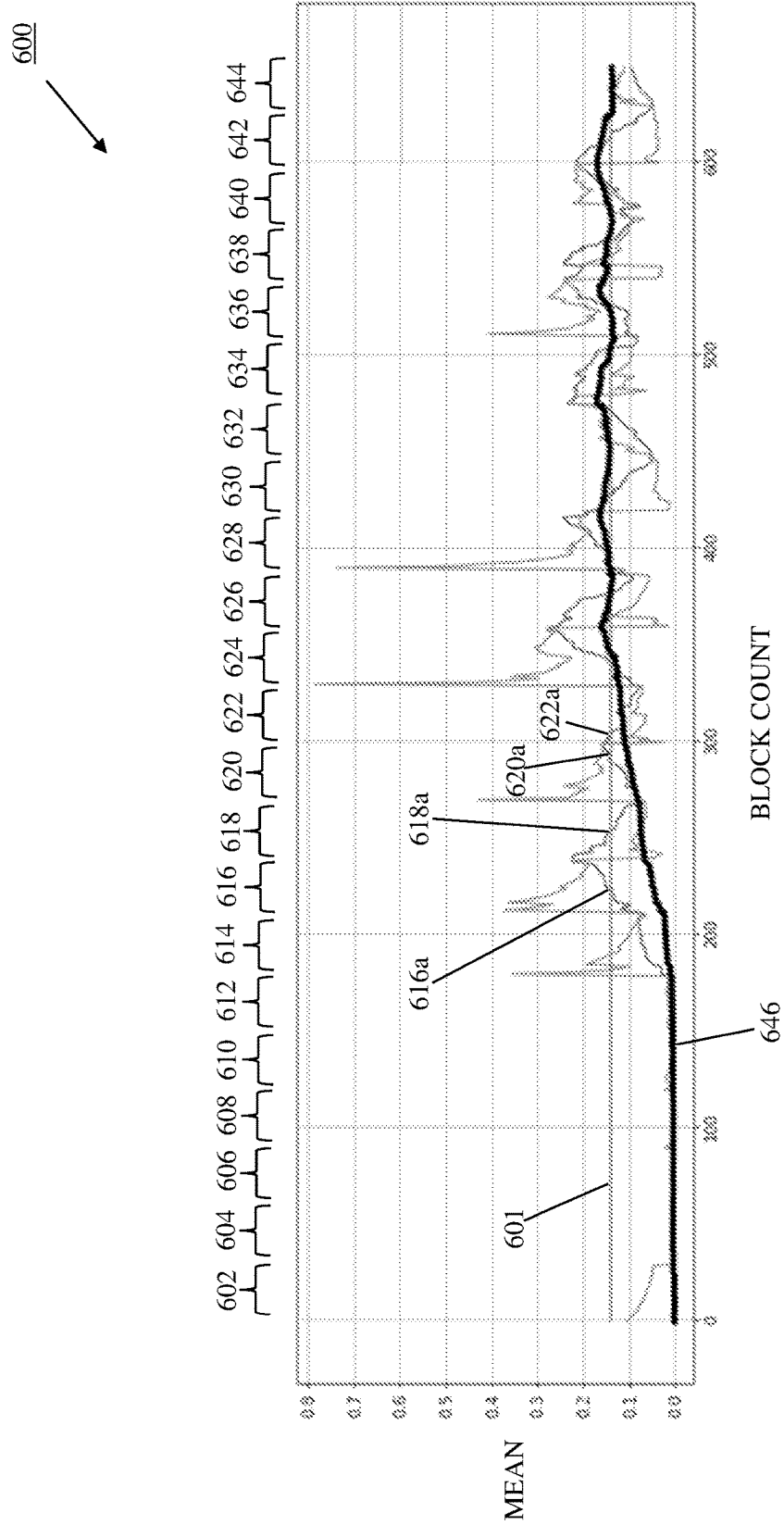
FIG. 6 is a graph view illustrating an embodiment of mean errors resulting from the pSLC scan of FIG. 5 that may be performed over the plurality of different read voltage thresholds during the method of FIG. 3.

With reference to FIG. 6, an embodiment of a graph 600 of a mean of errors experienced by blocks read from the storage subsystem 206 during a pSLC scan that may be performed over multiple iterations of block 302 is illustrated, and one of skill in the art in possession of the present disclosure will appreciate how the graph 500 discussed above with reference to FIG. 5 and the graph 600 may refer to the same pSLC scan. In an embodiment, a predetermined error range 601 may be defined for blocks/codewords read during the pSLC scan. In the specific example illustrated in FIG. 6, that predetermined error range 601 is approximately 0.14 mean Failed Bit Count (FBC) per codeword (FBC/CW) (and may include some threshold amount above and below 0.14 mean FBC/CW), although one of skill in the art in possession of the present disclosure will appreciate how other predetermined error ranges will fall within the scope of the present disclosure as well. As can be seen in FIG. 6, the pSLC scan in the graph 600 includes a first pSLC read operation 602 that was performed at block 302 (and that may be the same first pSLC read operation 502 performed using the first read voltage threshold ("$V_t$") of 0 as discussed above with reference to FIG. 5) and that resulted in a mean FBC/CW of approximately 0 for that data that was read.

If, at decision block 304, it is determined that the subset of pSLC data read from the storage subsystem did not experience errors within the predetermined error range, the method 300 proceeds to block 306 where the pSLC-scan-based storage device initialization subsystem modifies the pSLC scan read voltage threshold. In an embodiment, at block 306 and in response to the subset of the pSLC data read at block 302 experiencing errors outside of the predetermined error range, the pSLC-scan-based storage device initialization engine 204 in the storage device 200 may modify the read voltage threshold that was used in the most recent performance of block 302 for an immediately subsequent performance of block 302. In the specific examples below, the read voltage modifications performed at block 306 are provided by increasing the read voltage threshold that was used in the most recent performance of block 302 for an immediately subsequent performance of block 302 by 10 voltage steps in response to the errors experienced by the subset of the pSLC data read during the most recent performance of block 302 being below the predetermined error range, and decreasing the read voltage threshold that was used in the most recent performance of block 302 for an immediately subsequent performance of block 302 by 10 voltage steps in response to the errors experienced by the subset of the pSLC data read during the most recent performance of block 302 being above the predetermined error range. However, while specific voltage threshold modifications are described, one of skill in the art in possession of the present disclosure will appreciate how other read voltage threshold modifications will fall within the scope of the present disclosure as well.

As such, continuing with the specific example described above with reference to FIGS. 5 and 6, in response to the errors experienced by the subset of the pSLC data read during block 302 at the read voltage threshold of 0 being below the predetermined error range, the pSLC-scan-based storage device initialization engine 204 in the storage device 200 may increase the read voltage threshold to 10. The method 300 then returns to block 302. As such, the method 300 may loop such that the pSLC scan continues (e.g., via iterations of block 302) as long as the errors experienced by any subset of pSLC data read (e.g., during any iteration of block 302) are not within the predetermined error range, with the read voltage threshold increased for use in a subsequent iteration of block 302 if those errors are below the predetermined error range, and the read voltage threshold decreased for use in a subsequent iteration of block 302 if those errors are above the predetermined error range.

For example, with reference back to FIGS. 5 and 6, the graph 500 illustrates how a plurality of pSLC read operations 504, 506, 508, 510, 512, 514 may be performed at respective subsequent iterations of block 302 as part of the pSLC scan, with the graph 600 illustrating how the corresponding pSLC read operations 604, 606, 608, 610, 612, and 614 performed at those respective subsequent iterations of block 302 as part of the pSLC scan result in a mean FBC/CW that is below the predetermined error range 601 for that data that was read, thus providing for the increasing read voltage thresholds for the pSLC read operations 504, 506, 508, 510, 512, and 514 illustrated in FIG. 5. In other words, following the first pSLC read operation 502/602 at the read voltage threshold of 0 that results in errors below the predetermined error range 601 for the data that was read, the pSLC read operation 504/604 is performed with the read voltage threshold increased to 10 and results in errors below the predetermined error range 601 for the data that was read. The pSLC read operation 506/606 is then performed with the read voltage threshold increased to 20 and results in errors below the predetermined error range 601 for the data that was read, and so on with the PSLC read operations 508/608, 510/610, 512/612, and up until the pSLC read operation 514/614 is performed with the read voltage threshold increased to 60 and results in errors below the predetermined error range 601 for the data that was read.

The pSLC read operation 516/616 is then performed with the read voltage threshold increased to 70 and results in errors (e.g., the mean FBC/CW 616a illustrated in FIG. 6) that increase above the predetermined error range 601 for the data that was read. As can be seen in the specific example illustrated in FIGS. 5 and 6, following an increase in errors above the predetermined error range 601 for data read during a current pSLC read operation at a current read voltage threshold, the subsequent read voltage threshold may be decreased (e.g., by 10 voltage steps in the specific examples provided below) for the subsequent pSLC read operation. As such, the pSLC read operation 518/618 is performed with the read voltage threshold decreased to 60 and results in errors (e.g., the mean FBC/CW 618a illustrated in FIG. 6) that decrease below the predetermined error range 601 for the data that was read.

The pSLC scan may then be completed by increasing/decreasing the read voltage threshold for subsequent pSLC read operations such that errors for the data that is read remain around the predetermined error range. As such, the pSLC read operation 520/620 is performed with the read voltage threshold increased to 70 and results in errors (e.g., the mean FBC/CW 620a illustrated in FIG. 6) that increase above the predetermined error range 601 for the data that was read, the pSLC read operation 522/622 is performed with the read voltage threshold decreased to 60 and results in errors (e.g., the mean FBC/CW 622a illustrated in FIG. 6) that decrease below the predetermined error range 601 for the data that was read, and so on for the pSLC read operations 524/624-544/644 until the pSLC scan is completed. In the specific examples illustrated in FIGS. 5 and 6, a predetermined error range read voltage threshold estimate 546 (which is indicated by the bolded black line in FIG. 5 and may be computed by averaging the mean read voltage threshold over the previous five pSLC read operations) stabilizes over the course of the pSLC scan at a read voltage threshold of approximately 65 voltage steps, while a mean error rate 646 (which is indicated by the bolded black line in FIG. 6 and may be computed by averaging the mean errors over the previous five pSLC read operations) stabilizes over the course of the pSLC scan within the predetermined error range.

Figure 7:
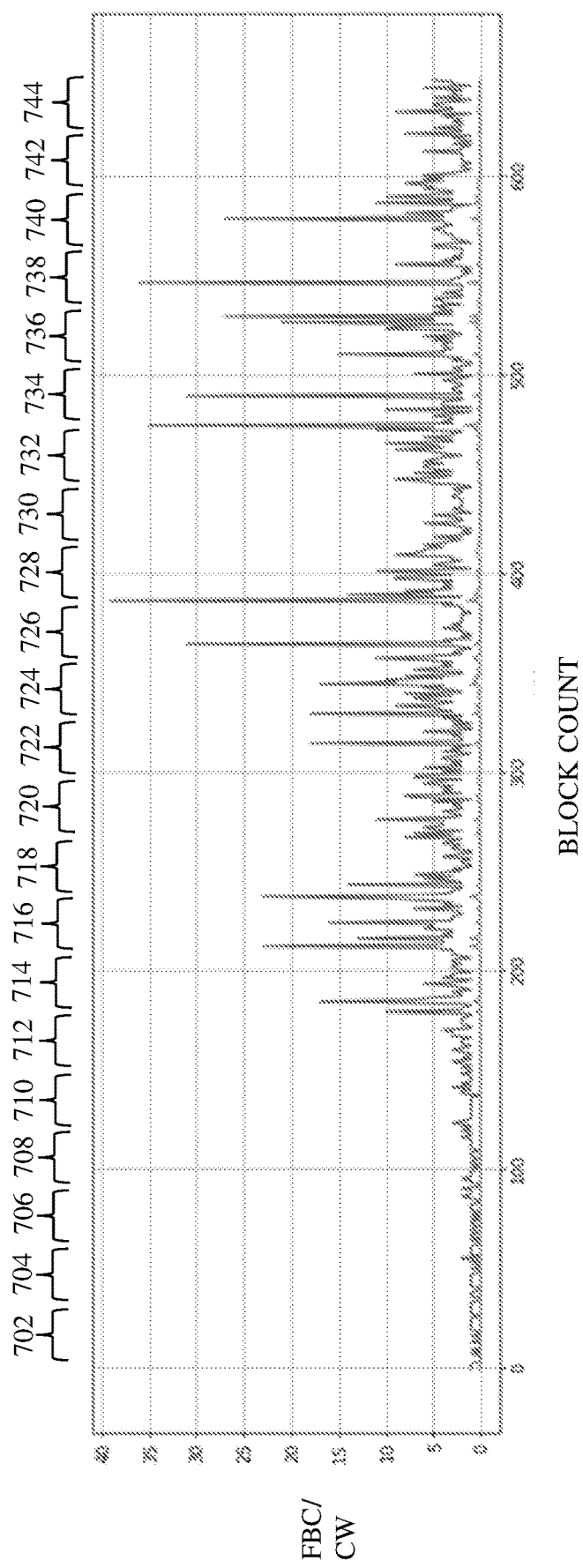
FIG. 7 is a graph view illustrating an embodiment of total errors resulting from the pSLC scan of FIG. 5 that may be performed over the plurality of different read voltage thresholds during the method of FIG. 3.

Furthermore, with reference to FIG. 7, an embodiment of a graph 700 of a total errors (e.g., FBC/CW in this example) experienced by blocks read from the storage subsystem 206 during a pSLC scan that may be performed over multiple iterations of block 302 is illustrated, and one of skill in the art in possession of the present disclosure will appreciate how the graph 500 discussed above with reference to FIG. 5, the graph 600 discussed above with reference to FIG. 6, and the graph 700 may refer to the same pSLC scan. As such, a plurality of pSLC read operations 702-744 may be performed as part of a pSLC scan and may correspond to the pSLC read operations 502-544 and 602-644 discussed above with reference to FIGS. 5 and 6, respectively. As can be seen in FIG. 7, the errors experienced by blocks read during the pSLC scan reach a maximum that is under 40 FBC/CW (e.g., at the pSLC read operations 726 and/or 728), which one of skill in the art in possession of the present disclosure will appreciate are relatively easy to correct using conventional error correction techniques. However, in the event the errors experienced by blocks read during the pSLC scan start to approach the limits of conventional error correction techniques, one of skill in the art in possession of the present disclosure will appreciate how the predetermined error range (e.g., the predetermined error range 601 in FIG. 6) may be adjusted to reduce those errors to a level that is correctable using conventional error correction techniques.

If at decision block 304, it is determined that the subset of pSLC data read from the storage subsystem experienced errors within the predetermined error range, the method 300 proceeds to block 308 where the pSLC-scan-based storage device initialization subsystem uses the pSLC read voltage threshold at which the subset of pSLC data read from the storage subsystem experienced errors within the predetermined error range to estimate a powered-off data retention time for the storage subsystem. As will be appreciated by one of skill in the art in possession of the present disclosure from the specific example described above, the determination that a subset of pSLC data read from the storage subsystem 206 experienced errors within the predetermined error range may be performed subsequent to a completed pSLC scan.

For example, the determination that a subset of pSLC data read from the storage subsystem 206 experienced errors within the predetermined error range at decision block 304 may be based on the predetermined error range read voltage threshold estimate 546 discussed above with reference to FIG. 5 that may be computed by averaging the mean read voltage threshold over the final five pSLC read operations performed in the pSLC scan (i.e., and which as discussed above may have stabilized at 65 voltage steps in that specific example). However, while a specific example has been provided, one of skill in the art in possession of the present disclosure will appreciate how the read voltage threshold that resulted in errors within the predetermined error range in the subset(s) of pSLC data read during the pSLC scan may be determined or otherwise identified in a variety of manners that will fall within the scope of the present disclosure as well.

In an embodiment, at block 308, the pSLC-scan-based storage device initialization engine 204 in the storage device 200 uses the read voltage threshold at which the subset(s) of pSLC data read from the storage subsystem 206 experienced errors within the predetermined error range to estimate a powered-off data retention time for the storage subsystem 206. For example, with reference to FIGS. 8A, 8B, 8C, and 8D, embodiments of graphs of errors ("MEAN FBC/CW") vs. read voltage thresholds ("$V_t$") for different powered-off data retention times for a storage subsystem/storage device are illustrated that, as discussed below, provides an example of how the read voltage threshold that results in the predetermined error range will shift depending on the powered-off data retention times for a storage subsystem/storage device.

Figure 8A:
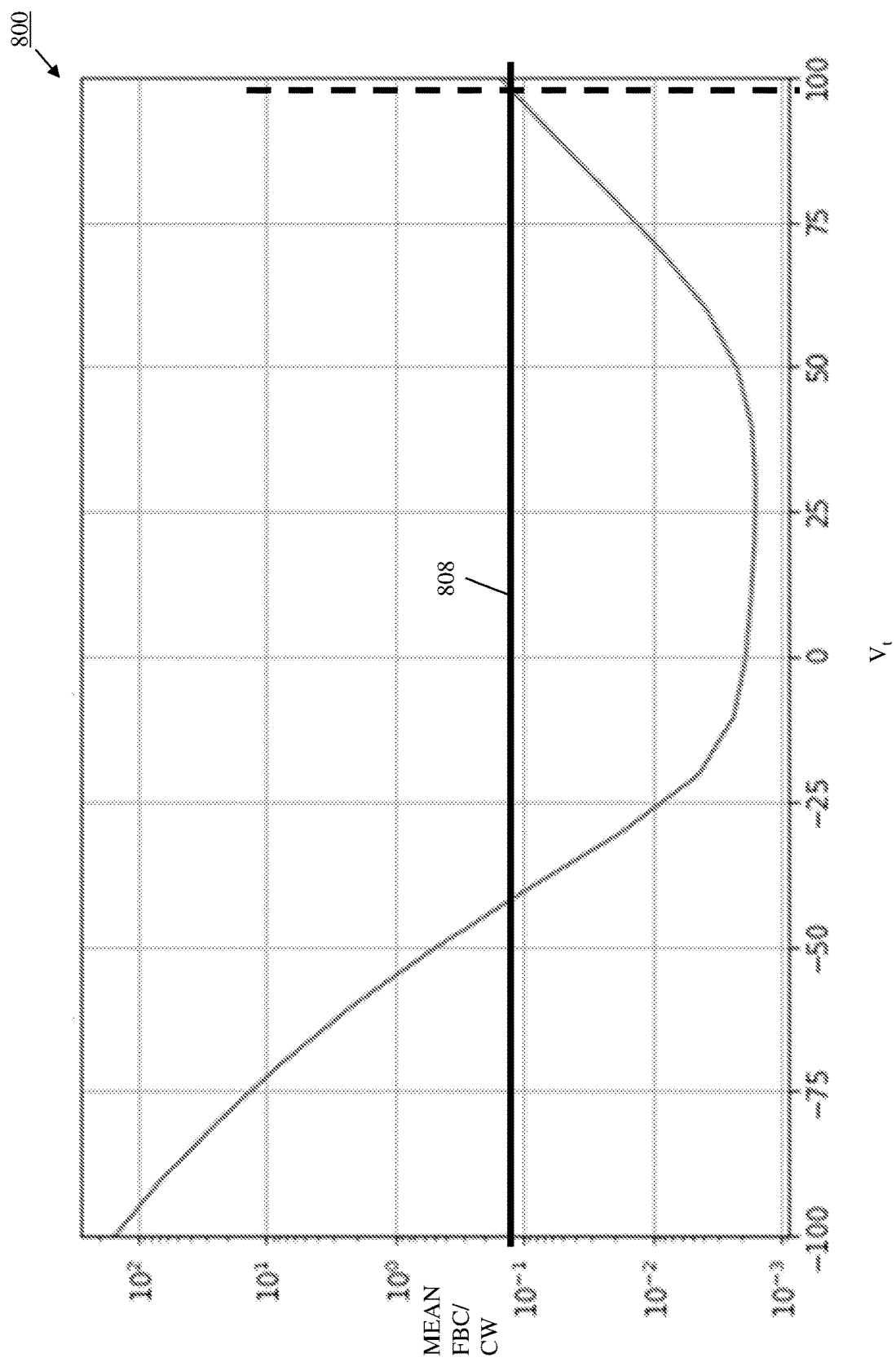
FIG. 8A is a graph view illustrating an embodiment of a pSLC scan that may be performed over a plurality of different read voltage thresholds during the method of FIG. 3.
Figure 8B:
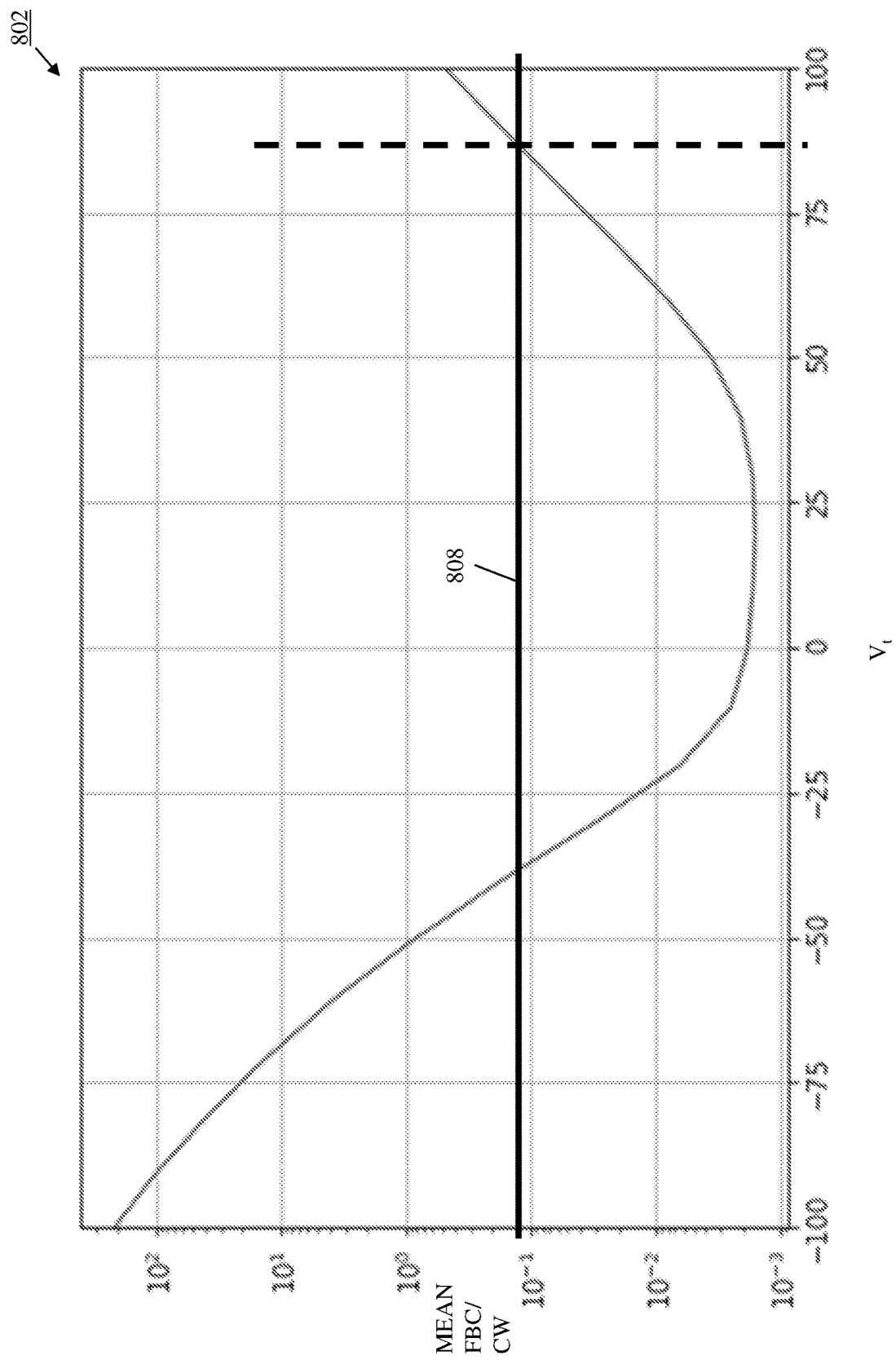
FIG. 8B is a graph view illustrating an embodiment of a pSLC scan that may be performed over a plurality of different read voltage thresholds during the method of FIG. 3.
Figure 8C:
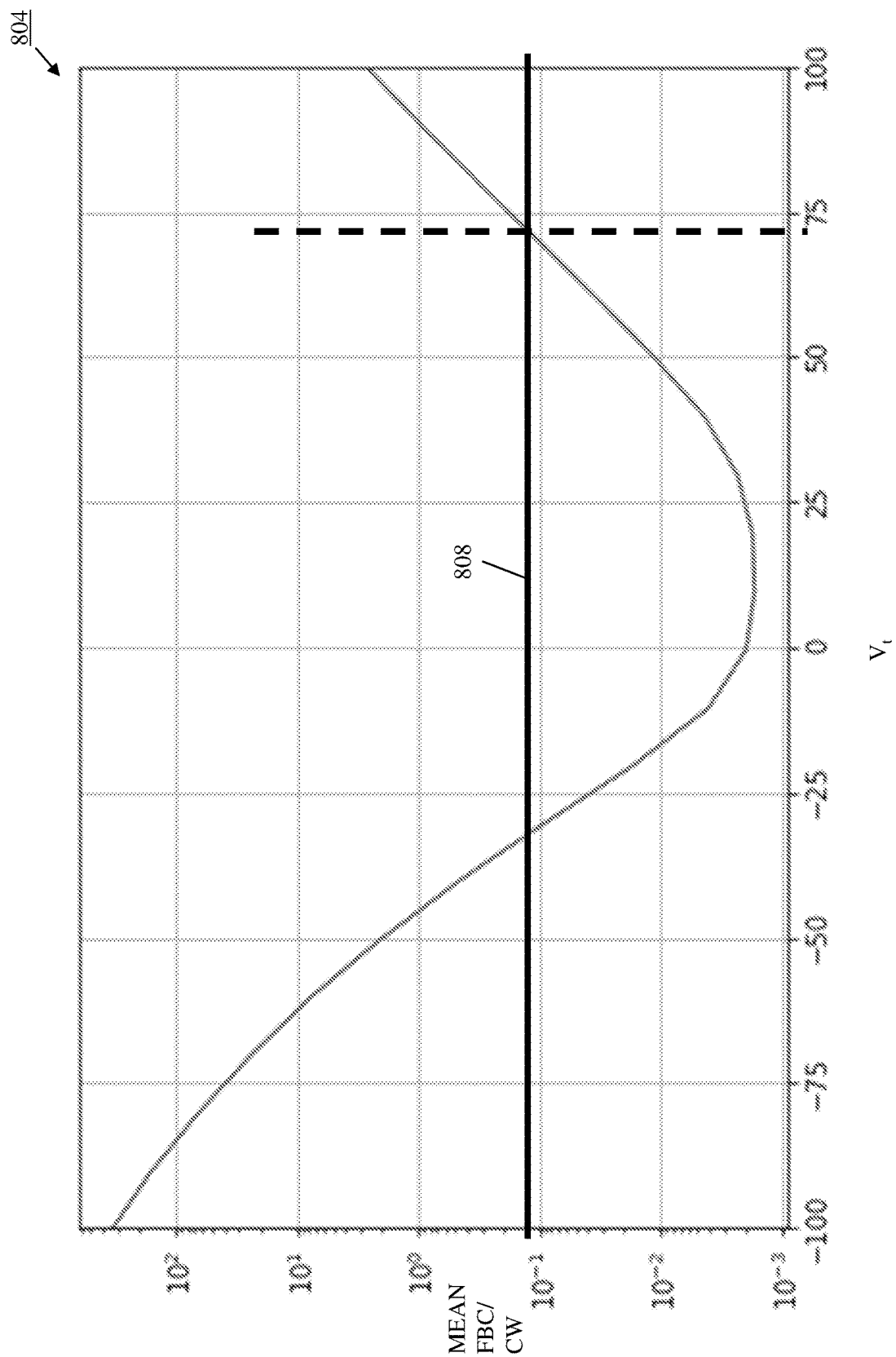
FIG. 8C is a graph view illustrating an embodiment of a pSLC scan that may be performed over a plurality of different read voltage thresholds during the method of FIG. 3.
Figure 8D:
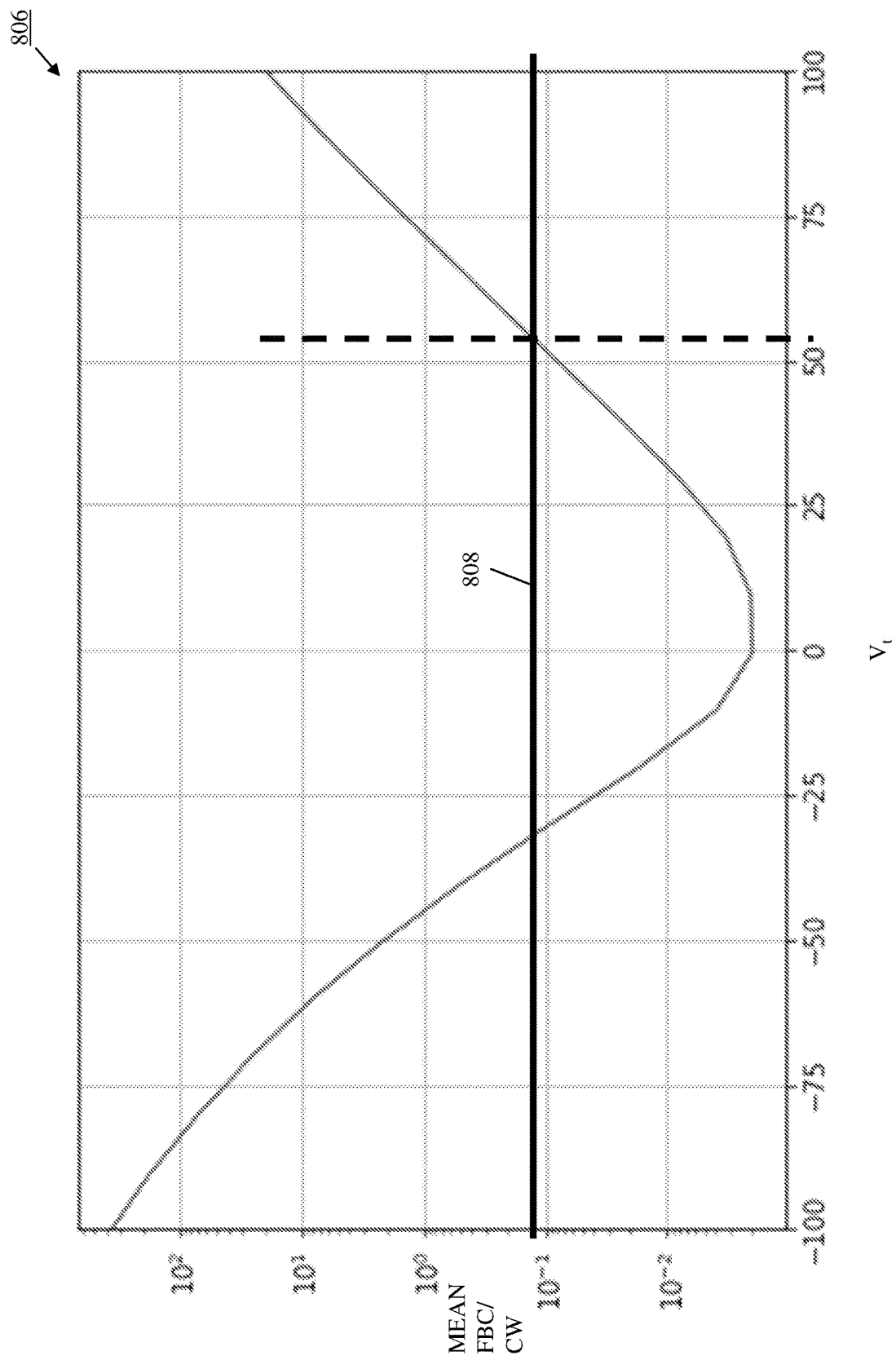
FIG. 8D is a graph view illustrating an embodiment of a pSLC scan that may be performed over a plurality of different read voltage thresholds during the method of FIG. 3.

For example, FIG. 8A illustrates a graph 800 of errors ("MEAN FBC/CW") experienced by data read during a pSLC scan performed over a plurality of read voltage thresholds ("$V_t$") in a storage subsystem/storage device that was powered on following a relatively short data retention event of less than one day, FIG. 8B illustrates a graph 802 of errors ("MEAN FBC/CW") experienced by data read during a pSLC scan performed over a plurality of read voltage thresholds ("$V_t$") in a storage subsystem/storage device that was powered on following a data retention event of approximately 19 days, FIG. 8C illustrates a graph 804 of errors ("MEAN FBC/CW") experienced by data read during a pSLC scan performed over a plurality of read voltage thresholds ("$V_t$") in a storage subsystem/storage device that was powered on following a data retention event of approximately 90 days, and FIG. 8D illustrates a graph 806 of errors ("MEAN FBC/CW") experienced by data read during a pSLC scan performed over a plurality of read voltage thresholds ("$V_t$") in a storage subsystem/storage device that was powered on following a data retention event of approximately 365 days.

As will be appreciated by one of skill in the art in possession of the present disclosure, the curves provided in the graphs 800, 802, 804, and 806 in FIGS. 8A-8D are indicative of errors at read voltage thresholds in the cells of the storage subsystem 206 that provide "1's" and "0's", with the "left" side of the graphs 800, 802, 804, and 806 indicative of the errors at read voltage thresholds for the "1's", and the "right" side of the graphs 800, 802, 804, and 806 indicative of the errors at read voltage thresholds for the "0's". As can be seen in FIGS. 8A-8D, the errors at read voltage thresholds for the "1's" voltages do not vary substantially over the different data retention times for the storage subsystem/storage device, while the errors at read voltage thresholds for the "0's" voltages vary over the different data retention times for the storage subsystem/storage device. For example, in this specific embodiment, the predetermined error range 408 has been defined near 10-1 mean FBC/CW as indicated by the bolded black horizontal line in each of the graphs 800-804, and the errors for the "1's" are within the predetermined error range 808 approximately between −30 to −40 voltage steps for each of the different data retention times for the storage subsystem/storage device.

However, as can be seen in FIG. 8A in this specific embodiment, the errors for the "0's" are within the predetermined error range 808 at approximately 95 voltage steps for the relatively short data retention event of less than one day (as indicated by the bolded dashed vertical line in FIG. 8A.) Furthermore, as can be seen in FIG. 8B in this specific embodiment, the errors for the "0's" are within the predetermined error range 808 at approximately 87 voltage steps for the data retention event of 19 days (as indicated by the bolded dashed vertical line in FIG. 8B). Further still, as can be seen in FIG. 8C in this specific embodiment, the errors for the "0's" are within the predetermined error range 808 at approximately 70 voltage steps for the data retention event of 90 days (as indicated by the bolded dashed vertical line in FIG. 8C). Yet further still, as can be seen in FIG. 8D in this specific embodiment, the errors for the "0's" are within the predetermined error range 808 at approximately 55 voltage steps for the data retention event of 365 days (as indicated by the bolded dashed vertical line in FIG. 8D).

As such, one of skill in the art in possession of the present disclosure will appreciate how the identification of the read voltage threshold at which the subset(s) of pSLC data read during the pSLC scan experience errors within the predetermined error range allows for a determination of a powered-off retention time for the storage subsystem/storage device. Continuing with the specific example provided above, a storage subsystem/storage device with pSLC data that experiences errors within the predefined voltage range when read at a read voltage threshold of 95 voltage steps (or above) may be estimated to have undergone a relatively short data retention event of less than one day. Similarly, a storage subsystem/storage device with pSLC data that experiences errors within the predefined voltage range when read at a read voltage threshold around 87 voltage steps may be estimated to have undergone a data retention event of 19 days, a storage subsystem/storage device with pSLC data that experiences errors within the predefined voltage range when read at a read voltage threshold around 70 voltage steps may be estimated to have undergone a data retention event of 90 days, and a storage subsystem/storage device with pSLC data that experiences errors within the predefined voltage range when read at a read voltage threshold around 55 voltage steps may be estimated to have undergone a data retention event of 365 days.

In some embodiments, the estimation of the powered-off data retention time for the storage subsystem/storage device at block 308 may utilize program-erase cycles for the storage subsystem/storage device along with the read voltage threshold at which the subset of pSLC data read from the storage subsystem 206 experienced the errors within the predetermined error range. For example, with reference to FIG. 9, an embodiment of a program-erase-cycle-based read voltage threshold/powered-off data retention time table 900 is illustrated that may be stored in the pSLC-scan-based storage device initialization database 208. As can be seen in the specific example illustrated in FIG. 9, the program-erase-cycle-based read voltage threshold/powered-off data retention time table 900 includes a first program-erase cycle column ("PEC<30000)") having read voltage threshold ("$V_t$")/powered off data retention time ("DR time") entries for a storage subsystem/storage device with less than 30000 program/erase cycles, and a second program-erase cycle column ("PEC>30000)") having read voltage threshold ("$V_t$")/powered off data retention time ("DR time") entries for that storage subsystem/storage device with more than 30000 program/erase cycles.

As such, one of skill in the art in possession of the present disclosure will appreciate how, at block 308, the pSLC-scan-based storage device initialization engine 204 in the storage device 200 may determine the number of program-erase cycles for the storage subsystem 206, and then use the read voltage threshold at which the subset(s) of pSLC data read from the storage subsystem 206 experienced errors within the predetermined error range to identify the powered-off data retention time of the storage subsystem/storage device. In one specific example using the program-erase-cyclebased read voltage threshold/powered-off data retention time table 900 of FIG. 9, for a storage subsystem 206 with less than 30000 program-erase cycles and from which subset(s) of pSLC data read from the storage subsystem 206 experienced errors within the predetermined error range at a read voltage threshold of 63 voltage steps, a powered-off data retention time of 50 days may be estimated. Similarly, for a storage subsystem 206 with more than 30000 program-erase cycles and from which subset(s) of pSLC data read from the storage subsystem 206 experienced errors within the predetermined error range at a read voltage threshold of 81 voltage steps, a powered-off data retention time of 39 days may be estimated. However, while several specific examples of the estimation of powered-off data retention times for storage subsystems/storage devices have been described, one of skill in the art in possession of the present disclosure will appreciate how other powered-off data retention times may be estimated using similar techniques that will fall within the scope of the present disclosure as well.

The method 300 then proceeds to block 310 where the pSLC-scan-based storage device initialization subsystem performs post-data-retention initialization operations based on the powered-off data retention time for the storage subsystem. In an embodiment, at block 310, the pSLC-scan-based storage device initialization engine 204 in the storage device 200 may use the powered-off data retention time for the storage subsystem/storage device to perform post-data-retention initialization operations that operate to initialization the storage subsystem 206 and/or storage device 200 for use. For example, the post-data-retention initialization operations performed at block 310 may include identifying a subset of a plurality of data retention event read voltage thresholds based on the powered-off data retention time determined for the storage subsystem 206/storage device 200, and using at least some of those plurality of data retention event read voltage thresholds to read non-pSLC data from the storage subsystem 206.

As discussed above, the storage subsystem 206 may include a plurality of non-pSLC data (e.g., stored on MLC/TLC NAND devices) that must be read as part of the initialization of the storage subsystem 206/storage device 200, and the storage device 200 may include a table of different read voltage thresholds at which the non-pSLC data should be read based on different data retention times experienced by the storage subsystem 206/storage device 200. As such, one of skill in the art in possession of the present disclosure will appreciate how the estimation of the powered-off data retention time for the storage subsystem 206/storage device 200 will allow the identification of a subset of those read voltage thresholds that are within a range of the estimated powered-off data retention time for use in reading the non-pSLC data, which will operate to reduce latency of the storage device 200 and avoid bandwidth reductions in the storage device 200 by reducing the number of read retries necessary to read the non-pSLC data (i.e., because the knowledge of the approximate powered-off data retention time allows the reads of the non-pSLC data to utilize read voltage thresholds optimized for the amount of time the storage subsystem/storage device was powered off in order to, for example, rebuild the storage subsystem/storage device following a data retention event).

In another example, the post-data-retention initialization operations performed at block 310 may include initializing the storage subsystem without performing a media scan based on the powered-off data retention time for the storage subsystem, and/or initializing the storage subsystem without performing garbage collection based on the powered-off data retention time for the storage subsystem. As will be appreciated by one of skill in the art in possession of the present disclosure, in the event the powered-off data retention time for the storage subsystem/storage device is relatively low (e.g., a power off/immediate power on event, a data retention event of less than a day, etc.), the performance of media scans, garbage collection, and/or other data retention event operations may be unnecessary, and thus those data retention event operations may be skipped and the storage subsystem/storage device initialized without them in order to avoid their associated latency and performance costs.

Thus, systems and methods have been described that provide for the estimation of a powered-off data retention time for a storage subsystem using information derived from a pSLC scan, and the performance of post-data-retention initialization operations based on that powered-off data retention time. For example, pSLC-scan-based storage device initialization system of the present disclosure may include a chassis, a storage subsystem that is housed in the chassis, and a pSLC-scan-based storage device initialization subsystem that is housed in the chassis and coupled to the storage subsystem. The pSLC-scan-based storage device initialization subsystem reads respective subsets of pSLC data from the storage subsystem over a plurality of different read voltage thresholds, and identifies a first read voltage threshold that is included in the plurality of different read voltage thresholds and at which a respective first subset of the pSLC data read from the storage subsystem experienced errors within a predetermined error range. The pSLC-scan-based storage device initialization subsystem then uses the first read voltage threshold to estimate a powered-off data retention time for the storage subsystem, and performs post-data-retention initialization operations based on the powered-off data retention time for the storage subsystem. As such, post-data-retention initialization operations for a storage device may be optimized based on the amount of time the storage device was powered off.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A pseudo Single Level Cell (pSLC)-scan-based storage device initialization system, comprising:
   a chassis;
   a storage subsystem that is housed in the chassis; and
   a pSLC-scan-based storage device initialization subsystem that is housed in the chassis, coupled to the storage subsystem, and is configured to:
      read respective subsets of pSLC data from the storage subsystem over a plurality of different read voltage thresholds;
      identify a first read voltage threshold that is included in the plurality of different read voltage thresholds and at which a respective first subset of the pSLC data read from the storage subsystem experienced errors within a predetermined error range;
      use the first read voltage threshold to estimate a powered-off data retention time for the storage subsystem; and perform post-data-retention initialization operations based on the powered-off data retention time for the storage subsystem.

2. The system of claim 1, wherein the post-data-retention initialization operations include:
identify a subset of a plurality of data retention event read voltage thresholds based on the powered-off data retention time for the storage subsystem; and
use at least some of the plurality of data retention event read voltage thresholds to read non-pSLC data from the storage subsystem.

3. The system of claim 1, wherein the post-data-retention initialization operations include:
initialize the storage subsystem without performing a media scan based on the powered-off data retention time for the storage subsystem.

4. The system of claim 1, wherein the post-data-retention initialization operations include:
initialize the storage subsystem without performing garbage collection based on the powered-off data retention time for the storage subsystem.

5. The system of claim 1, wherein the pSLC-scan-based storage device initialization subsystem is configured to:
identify a number of program-erase cycles for the storage subsystem; and
use the number of program-erase cycles for the storage subsystem and the first read voltage threshold to estimate the powered-off data retention time for the storage subsystem.

6. The system of claim 1, wherein the reading the respective subsets of the pSLC data from the storage subsystem over the plurality of different read voltage thresholds and identifying the first read voltage threshold that is included in the plurality of different read voltage thresholds and at which the respective first subset of the pSLC data read from the storage subsystem experienced errors within the predetermined error range includes:
reading a respective second subset of the pSLC data from the storage subsystem using a respective second read voltage threshold that is included in the plurality of different read voltage thresholds and at which the respective second subset of the pSLC data read from the storage subsystem experiences errors outside the predetermined error range;
modify, in response to the respective second subset of the pSLC data experiencing errors outside the predetermined error range, the respective second read voltage threshold to the respective first read voltage threshold; and
reading the respective first subset of the pSLC data from the storage subsystem using the respective first read voltage threshold that is included in the plurality of different read voltage thresholds and at which the respective first subset of the pSLC data read from the storage subsystem experiences errors within the predetermined error range.

7. An Information Handling System (IHS), comprising:
a processing system; and
a memory system that is coupled to the processing system and that includes instructions that, when executed by the processing system, cause the processing system to provide a pseudo Single Level Cell (pSLC)-scan-based storage device initialization engine that is configured to:
read respective subsets of pSLC data from a storage subsystem over a plurality of different read voltage thresholds;
identify a first read voltage threshold that is included in the plurality of different read voltage thresholds and at which a respective first subset of the pSLC data read from the storage subsystem experienced errors within a predetermined error range;
use the first read voltage threshold to estimate a powered-off data retention time for the storage subsystem; and
perform post-data-retention initialization operations based on the powered-off data retention time for the storage subsystem.

8. The IHS of claim 7, wherein the post-data-retention initialization operations include:
identify a subset of a plurality of data retention event read voltage thresholds based on the powered-off data retention time for the storage subsystem; and
use at least some of the plurality of data retention event read voltage thresholds to read non-pSLC data from the storage subsystem.

9. The IHS of claim 7, wherein the post-data-retention initialization operations include:
initialize the storage subsystem without performing a media scan based on the powered-off data retention time for the storage subsystem.

10. The IHS of claim 7, wherein the post-data-retention initialization operations include:
initialize the storage subsystem without performing garbage collection based on the powered-off data retention time for the storage subsystem.

11. The IHS of claim 7, wherein the pSLC-scan-based storage device initialization engine is configured to:
identify a number of program-erase cycles for the storage subsystem; and
use the number of program-erase cycles for the storage subsystem and the first read voltage threshold to estimate the powered-off data retention time for the storage subsystem.

12. The IHS of claim 7, wherein the reading the respective subsets of the pSLC data from the storage subsystem over the plurality of different read voltage thresholds and identifying the first read voltage threshold that is included in the plurality of different read voltage thresholds and at which the respective first subset of the pSLC data read from the storage subsystem experienced errors within the predetermined error range includes:
reading a respective second subset of the pSLC data from the storage subsystem using a respective second read voltage threshold that is included in the plurality of different read voltage thresholds and at which the respective second subset of the pSLC data read from the storage subsystem experiences errors above the predetermined error range;
decreasing, in response to the respective second subset of the pSLC data experiencing errors above the predetermined error range, the respective second read voltage threshold to the respective first read voltage threshold; and
reading the respective first subset of the pSLC data from the storage subsystem using the respective first read voltage threshold that is included in the plurality of different read voltage thresholds and at which the respective first subset of the pSLC data read from the storage subsystem experiences errors within the predetermined error range.

13. The IHS of claim 7, wherein the reading the respective subsets of the pSLC data from the storage subsystem over the plurality of different read voltage thresholds and identifying the first read voltage threshold that is included in the plurality of different read voltage thresholds and at which the respective first subset of the pSLC data read from the storage subsystem experienced errors within the predetermined error range includes:
  reading a respective second subset of the pSLC data from the storage subsystem using a respective second read voltage threshold that is included in the plurality of different read voltage thresholds and at which the respective second subset of the pSLC data read from the storage subsystem experiences errors below the predetermined error range;
  increasing, in response to the respective second subset of the pSLC data experiencing errors below the predetermined error range, the respective second read voltage threshold to the respective first read voltage threshold; and
  reading the respective first subset of the pSLC data from the storage subsystem using the respective first read voltage threshold that is included in the plurality of different read voltage thresholds and at which the respective first subset of the pSLC data read from the storage subsystem experiences errors within the predetermined error range.

14. A method for initializing a storage device based on information derived from a pseudo Single Level Cell (pSLC) scan, comprising:
  reading, by a pseudo Single Level Cell (pSLC)-scan-based storage device initialization subsystem, respective subsets of pSLC data from a storage subsystem over a plurality of different read voltage thresholds;
  identifying, by the pSLC-scan-based storage device initialization subsystem, a first read voltage threshold that is included in the plurality of different read voltage thresholds and at which a respective first subset of the pSLC data read from the storage subsystem experienced errors within a predetermined error range;
  using, by the pSLC-scan-based storage device initialization subsystem, the first read voltage threshold to estimate a powered-off data retention time for the storage subsystem; and
  performing, by the pSLC-scan-based storage device initialization subsystem, post-data-retention initialization operations based on the powered-off data retention time for the storage subsystem.

15. The method of claim 14, wherein the post-data-retention initialization operations include:
  identifying a subset of a plurality of data retention event read voltage thresholds based on the powered-off data retention time for the storage subsystem; and
  using at least some of the plurality of data retention event read voltage thresholds to read non-pSLC data from the storage subsystem.

16. The method of claim 14, wherein the post-data-retention initialization operations include:
  initializing the storage subsystem without performing a media scan based on the powered-off data retention time for the storage subsystem.

17. The method of claim 14, wherein the post-data-retention initialization operations include:
  initializing the storage subsystem without performing garbage collection based on the powered-off data retention time for the storage subsystem.

18. The method of claim 14, further comprising:
  identifying, by the pSLC-scan-based storage device initialization subsystem, a number of program-erase cycles for the storage subsystem; and
  using, by the pSLC-scan-based storage device initialization subsystem, the number of program-erase cycles for the storage subsystem and the first read voltage threshold to estimate the powered-off data retention time for the storage subsystem.

19. The method of claim 14, wherein the reading the respective subsets of the pSLC data from the storage subsystem over the plurality of different read voltage thresholds and identifying the first read voltage threshold that is included in the plurality of different read voltage thresholds and at which the respective first subset of the pSLC data read from the storage subsystem experienced errors within the predetermined error range includes:
  reading a respective second subset of the pSLC data from the storage subsystem using a respective second read voltage threshold that is included in the plurality of different read voltage thresholds and at which the respective second subset of the pSLC data read from the storage subsystem experiences errors above the predetermined error range;
  decreasing, in response to the respective second subset of the pSLC data experiencing errors above the predetermined error range, the respective second read voltage threshold to the respective first read voltage threshold; and
  reading the respective first subset of the pSLC data from the storage subsystem using the respective first read voltage threshold that is included in the plurality of different read voltage thresholds and at which the respective first subset of the pSLC data read from the storage subsystem experiences errors within the predetermined error range.

20. The method of claim 14, wherein the reading the respective subsets of the pSLC data from the storage subsystem over the plurality of different read voltage thresholds and identifying the first read voltage threshold that is included in the plurality of different read voltage thresholds and at which the respective first subset of the pSLC data read from the storage subsystem experienced errors within the predetermined error range includes:
  reading a respective second subset of the pSLC data from the storage subsystem using a respective second read voltage threshold that is included in the plurality of different read voltage thresholds and at which the respective second subset of the pSLC data read from the storage subsystem experiences errors below the predetermined error range;
  increasing, in response to the respective second subset of the pSLC data experiencing errors below the predetermined error range, the respective second read voltage threshold to the respective first read voltage threshold; and
  reading the respective first subset of the pSLC data from the storage subsystem using the respective first read voltage threshold that is included in the plurality of different read voltage thresholds and at which the respective first subset of the pSLC data read from the storage subsystem experiences errors within the predetermined error range.

* * * * *